United States Patent [19]
Hong

[11] Patent Number: 5,712,794
[45] Date of Patent: Jan. 27, 1998

[54] AUTOMATED METHOD FOR ADDING ATTRIBUTES INDENTIFIED ON A SCHEMATIC DIAGRAM TO AN INTEGRATED CIRCUIT LAYOUT

[75] Inventor: Merit Hong, Chandler, Ariz.

[73] Assignee: Motorola, Inc., Schaumburg, Ill.

[21] Appl. No.: 552,425

[22] Filed: Nov. 3, 1995

[51] Int. Cl.$^6$ ............................................. G06F 17/50
[52] U.S. Cl. ........................................ 364/491; 364/488
[58] Field of Search ................................ 364/488, 489, 364/490, 491

[56] References Cited

U.S. PATENT DOCUMENTS

| | | | |
|---|---|---|---|
| 4,635,208 | 1/1987 | Coleby et al. | 364/491 |
| 5,097,422 | 3/1992 | Corbin, II et al. | 364/491 |
| 5,301,318 | 4/1994 | Mittal | 395/600 |
| 5,384,710 | 1/1995 | Lam et al. | 364/489 |
| 5,452,226 | 9/1995 | Hooper et al. | 364/489 |
| 5,455,775 | 10/1995 | Huber et al. | 364/488 |
| 5,623,418 | 4/1997 | Rostoker et al. | 364/489 |
| 5,623,420 | 4/1997 | Yee et al. | 364/490 |

OTHER PUBLICATIONS

Batra et al.,"Hcompare: A Hierarchical Netlist Comparison Program," 1992 29$^{th}$ ACM/IEEE DAC, Paper 21.1, pp. 299–304.

Armstrong et al., "FICOM: A Framework for Incremental Consistency Maintenance in Multi-Representation, Structural VLSI Databases," ICCAD '92, pp. 336–343.

*Primary Examiner*—Kevin J. Teska
*Assistant Examiner*—Leigh Marie Garbowski
*Attorney, Agent, or Firm*—Gary W. Hoshizaki

[57] ABSTRACT

An attribute on a netlist (31) is placed on a layout (33) to allow an automated approach for adding a feature to the layout (33) to be implemented. The netlist (31) or schematic diagram of a circuit is simulated on a Computer Aided Design (CAD) tool to verify circuit functionality. A layout tool (32) generates the layout (33) of the netlist (31). Adding a feature, for example, an extra implant to a source region of a device requires knowledge of device orientation not included in the layout (33). A Layout Versus Schematic (LVS) program (34) is run with the netlist (31) and the layout (33). Connectivity information from the LVS run is retrieved and placed in a connectivity mapping file (35). A mapping program (36) uses the connectivity mapping file (35) and the layout (33) to generate layers indicating and marking device orientation. The layers when added to the layout (33) produce an oriented layout (37). A layer generation program (38) uses the oriented layout (37) and the connectivity mapping file (35) to generate layers required to produce the feature on devices of the oriented layout (37).

12 Claims, 1 Drawing Sheet

FIG. 3 ously non-symmetric MOSFET devices in
which either the drain or source has a higher capacitance.
Placing the highest capacitance side of the transistor to the
lowest resistance path insures the highest speed by allowing
the capacitance to be rapidly charged and discharged
through a low resistance. For example, a p-channel MOS-
FET having an extra implant near the source to reduce punch
through and adjust the device threshold voltage will have a
higher capacitance than the drain. In general, the source of
the p-channel MOSFET is coupled nearest the positive most
power supply voltage to minimize the resistive path ther-
ebetween.

There are exceptions to the logic flow criterion stated
above. One such instance occurs when a large number of
pass transistors are connected to a speed-critical bus for
reading. The logic flow criterion may dictate that the higher
capacitance side of a pass transistor be coupled to the bus
which reduces the operating speed of the bus. A better
approach in this circumstance would be to minimize capaci-
tance loading the bus down by coupling the side of a
transistor having the lowest capacitance to the bus.

It should be noted that transistor orientation describe
hereinabove corresponds to how a transistor is coupled in a
circuit. For example, a digital logic circuit typically has the
p-channel MOSFETs coupled to the positive most power
supply and the n-channel MOSFETs coupled to the negative
most power supply. The logic flow criterion does not provide

AUTOMATED METHOD FOR ADDING ATTRIBUTES INDENTIFIED ON A SCHEMATIC DIAGRAM TO AN INTEGRATED CIRCUIT LAYOUT

BACKGROUND OF THE INVENTION

This invention relates, in general, to integrated circuit layout, and more particularly, to automatically editing pre-existing layouts.

An integrated circuit technology such as Complementary Metal Oxide Semiconductors (CMOS) is widely used throughout the electronic industry. The prevalence of certain technologies has led to Computer Aided Design (CAD) Tools being developed which greatly decreases the cycle time of a circuit design and layout. In general, the CAD tools are built to be compatible with most generic integrated circuit processes. Circuit synthesis, simulation, worst case analysis, layout generation, and layout verification are a few of the tasks handled by the CAD tools.

One constant aspect of the semiconductor industry is that change occurs to produce faster, denser, cheaper, and more manufacturable integrated circuits than previous genera-
tions. Wafer processes that produce extremely small devices or devices with specific characteristics may have layout steps that are not compatible with a CAD tool. Layouts may have to be edited by hand to incorporate processing steps that are unique to a wafer process flow which can increase the development time of an integrated circuit.

It would be of great benefit if a method could be devel-
oped that allowed a CAD tool to layout circuits having process steps that differ from a generic wafer process flow.

DETAILED DESCRIPTION OF THE DRAWINGS

Figure 1:
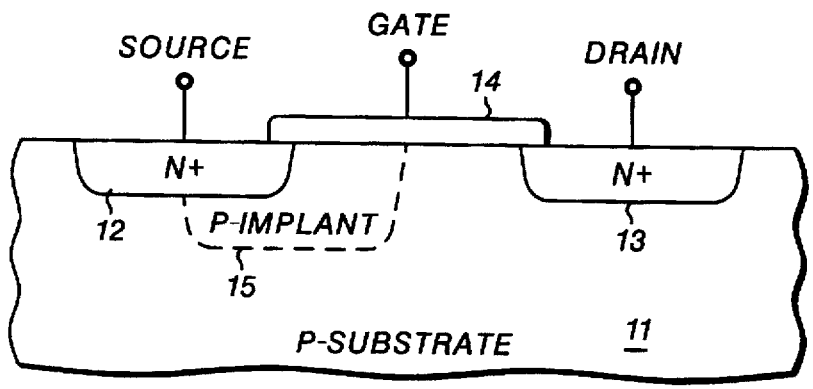
FIG. 1 is a cross-sectional view of a n-channel Metal Oxide Semiconductor Field Effect Transistor (MOSFET) having an extra implant located at a source region of the device.

A Computer Aided Design (CAD) tool is a computer work station with dedicated software for generating an integrated circuit. A schematic diagram or netlist of a circuit is gener-
ated for simulating functionality and worst case performance of the circuit. A layout is generated by a layout program or a layout person from the schematic diagram once the circuit design is finalized. The layout is compared against the schematic diagram using a Layout Versus Schematic (LVS) program which verifies the layout corresponds to the sche-
matic diagram. A final layout check is a Design Rule Check (DRC) which verifies the layout meets the wafer processing rules for the semiconductor process.

In general, CAD tools are developed by software com-
panies for semiconductor manufacturers. The programs are robust and general to meet the needs of most semiconductor companies. It is well known that semiconductor wafer processes are becoming more complex as device geometries are reduced to increase circuit density. Additional process steps are sometimes required in a semiconductor wafer process that are unique to a particular semiconductor manu-
facturer. It is also common for semiconductor manufacturers to add special wafer processing steps to give devices specific characteristics which enhance performance. In either case, additional layout steps are required that are not automati-
cally generated by the CAD tools. An inefficient method commonly used by semiconductor manufacturers is to manually generate the additional masks required for a non-
standard wafer process. Manual generation of these special layers increases costs and reduces manufacturing cycle time.

One example that clearly illustrates the problem associ-
ated with a unique wafer process flow are extra implants at either a source or drain region of a Metal Oxide Semicon-
ductor Field Effect Transistor (MOSFET). MOSFETs are susceptible to problems such as punch through or hot electron effects as the gate lengths are reduced to the sub-micron range. Punch through and threshold voltage of a MOSFET are often controlled by an implant at the source of the device. The doping would be of the same conductivity as the bulk or substrate of the device Hot electron effects are reduced by a lightly doped drain region. The lightly doped drain region is placed next to a heavily doped drain region and is closer in proximity to the channel region of a MOSFET. The lightly doped drain region reduces the elec-
tric field near the drain of the device that could produce hot carriers. In either case a generic CAD tool does not auto-
matically generate a mask layer for these extra implants. In fact, a layout program typically does not distinguish between a drain and a source of a MOSFET. The extra implant has the effect of giving a MOSFET an orientation. In other words, a drain and source identification in a layout is critical to insure the extra implant is provided to the proper side of a MOSFET.

In the preferred embodiment, logic flow typically deter-
mines transistor orientation. In a classical Complementary MOSFET (CMOS) design logic flow corresponds to opti-
mum performance in that the side of a transistor with highest capacitance is connected to a node having the least resistive path to a power supply terminal. Extra implants as described hereinabove produce non-symmetric MOSFET devices in a definitive answer when n-channel MOSFETs are coupled to the positive most power supply or p-channel MOSFETs are coupled to the negative most power supply (nonstandard). A decision must be made due to the conditions which occur due to the orientation. Placing a non-standard connected MOSFET with the higher capacitance side away from power supply reduces speed but decreases leakage currents. Conversely, placing the non-standard connected MOSFET with the higher capacitance side closest to the power supply will increase performance while increasing leakage currents.

In general, a method is developed that automatically adds a feature to a non-oriented layout that is generated by a CAD tool. First, a database is generated from a Layout Versus Schematic (LVS) program. The database correlates the netlist (or schematic diagram) to the layout. Second, the layout database is tagged to indicate device orientation from a mapping file generated by the LVS program thus generating an oriented layout. Finally, a layer (or layers) are generated for the oriented layout which add the feature to specific areas of a device determined from the device orientation.

FIG. 1 is an illustration of a n-channel Metal Oxide Semiconductor Field Effect Transistor (MOSFET) having a p-implant 15 that requires knowledge of the MOSFET transistor orientation to generate a masking layer for wafer process. The n-channel MOSFET is formed in a p-substrate 11. The n-channel MOSFET comprises a n+ source implant 12, a n+ drain implant 13, a gate 14, and a p-implant 15. P-implant 15 is placed near the source side of the n-channel MOSFET. P-implant 15 as shown in FIG. 1 is often a threshold voltage implant or an implant to reduce device punch through. The MOSFET is symmetrical without p-implant 15. In general, a layout of a MOSFET is formed without information identifying device orientation. Generating a masking layer, for example for p-implant 15 is not easily accomplished without orientation information such as a drain and source identification.

Figure 2:
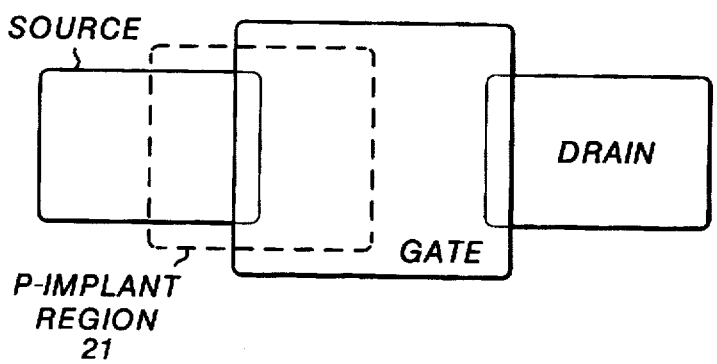
FIG. 2 is an illustration showing a p-implant region of a masking layer used in a semiconductor wafer process step corresponding to the extra implant of FIG. 1.

FIG. 2 is an illustration of a masking layer that is generated to add p-implant 15 shown in FIG. 1. P-implant region 21 of the masking layer corresponds to p-implant 15 of FIG. 1. P-dopant is implanted through the p-implant region 21 whereas other areas not having a p-implant region are blocked from receiving an implant. P-implant region 21 overlaps the gate and source regions of the device by an area determined by the wafer processing rules. Generating a mask having p-implant region 21 requires at least that the source or the drain of the device be identified on the layout.

Figure 3:
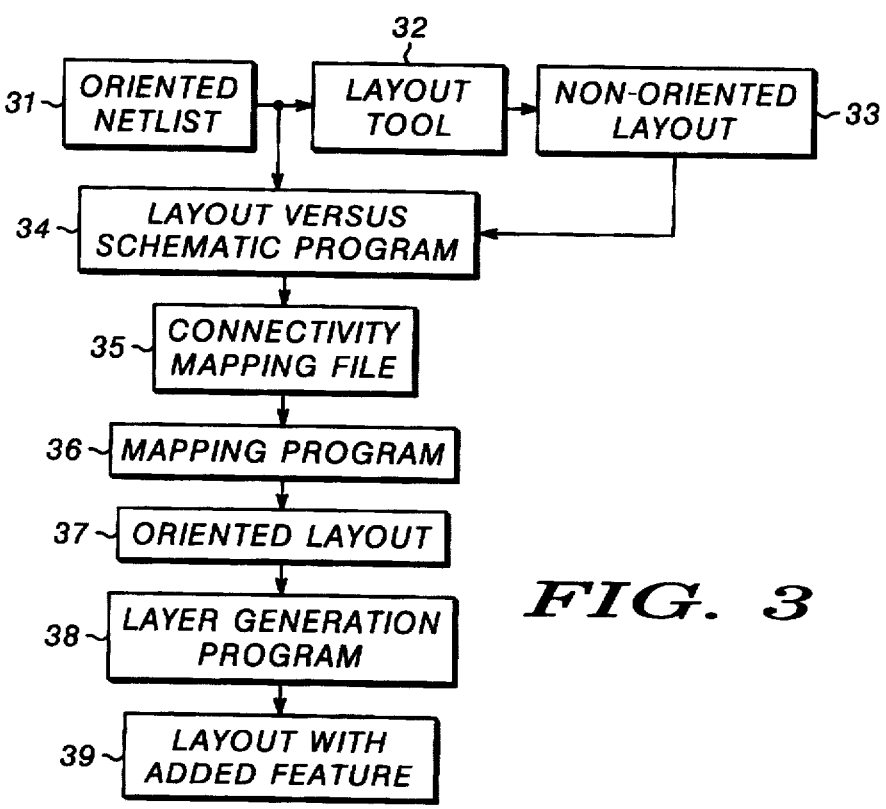
FIG. 3 is a block diagram of an automated process for adding additional features to a semiconductor device by generating an oriented layout and adding layers to the oriented layout corresponding to the additional features.

FIG. 3 is a block diagram of a conversion process for adding features to a non-oriented layout. In the preferred embodiment, the conversion process is automated to run in a Computer Aided Design (CAD) tool. CAD tool programs automate the process of generating an integrated circuit. CAD tool programs are widely available to semiconductor manufacturers for simulation, layout, and verification of a circuit design. Software vending companies such as Cadence, Mentor Graphics, and Integrated Silicon Systems are well known by one skilled in the art for providing integrated circuit design software. A layout tool generates a layout of a circuit from a schematic diagram or netlist. The term schematic diagram or netlist is used interchangeably as a description of a circuit. The layout generated by a CAD tool is used to form masks for semiconductor photolithographic wafer processing. A Layout Versus Schematic (LVS) program verifies the layout corresponds to the netlist of the circuit. Both the layout tool and the LVS program are common elements of a CAD tool.

Often in the process of updating a semiconductor wafer process, additional features are added that cannot be automatically generated by a CAD tool. As mentioned previously, a threshold implant, a punch through implant, or a Lightly Doped Drain (LDD) region, are just a few of the asymmetrical features that are added to sub-micron wafer processes. The asymmetry of the implants cannot be automatically generated by existing CAD tools because it requires knowledge of device orientation which is not included in a CAD tool generated layout. An attribute such as a drain or source identification is typically contained in a schematic diagram or netlist of a circuit. A feature such as an extra implant which requires knowledge of device orientation is typically added manually to the layout since the CAD tool would be unable to locate the side of the device in which to place the extra implant. In general, a draftsperson would draw the layers required to add the feature using a layout editing tool. Manual editing of a layout often requires significant investments in time and resources. The block diagram of FIG. 3 illustrates additional steps that allows a CAD tool to automatically generate layers to add a feature to a layout thereby decreasing design cycle time and reducing development costs.

A schematic diagram or oriented netlist 31 of a circuit provides device information such as a transistor geometry and the interconnections between devices. Oriented netlist 31 often includes information pertaining to device orientation, device characteristics or attributes pertaining to any aspect of the circuit. Oriented netlist 31 is provided to a layout tool 32 to generate a layout of the circuit. In general, the layout comprises a physical description of masking layers used to control where dopants are implanted or where materials are deposited on a semiconductor wafer. Layout tool 32 generates a non-oriented layout 33. For example, a drain or source of a device could not be easily determined from the layout. Non-oriented layout 33 is sufficient for most circuit designs and wafer processes that are currently used today.

Adding a feature, for example, an extra implant near the source of a device, to non-oriented layout 33 requires that the area on the layout where the extra implant is placed can be found. For example, an extra implant as described in FIGS. 1 and 2 requires that the source regions of each device requiring the extra implant be found on the layout. The source region of devices in non-oriented layout 33 could not be found since their are no source or drain identifications on the layout.

A Layout Versus Schematic (LVS) program 34 compares oriented netlist 31 to non-oriented layout 33. The primary purpose of the LVS program is to verify that the physical layout corresponds to the netlist. In the verification process, LVS program 34 generates information that maps oriented netlist 31 to non-oriented layout 33. In general, an LVS program generates a Connectivity mapping file 35 is used to place markings on non-oriented layout 33 that indicate device orientation or other characteristics not included in a layout. A mapping program 36 uses the information in connectivity mapping file 35 to produce new layers that identify specific attributes in oriented netlist 31. Non-oriented layout 33 typically comprises a multitude of different layers corresponding to semiconductor wafer process steps. For example, adding an extra implant to a source region of a MOSFET requires the sources of MOSFETs in a layout be identified. One method of identifying device attributes in a layout is to generate new layers having polygons that indicate a specific attribute. For example, polygons can be placed on a new layer in areas corresponding to the location of MOSFET sources in non-oriented layout 33. The new layer is called when a source of a MOSFET needs to be identified on the layout. Once the source of a MOSFET is found, a feature could be added to the source of the MOSFET which complies with the wafer process rules. The addition of a layer or layers identifying orientation, other device characteristics, or attributes to non-oriented layout 33 using information in connectivity mapping file 35 produces oriented layout 37.

Net-Specific attributes or Device-Specific attributes are two types of attributes corresponding to an added feature. A device-specific attribute is an attribute that is inherent to a device on a schematic diagram. An example of a device-specific attribute is a transistor threshold voltage or a transistor orientation. A net-specific attribute is an attribute that applies to the schematic device net connections. For example, in a series connection of transistors, the stacking order of the transistors does not change the logical function. Thus, the assignment of a net-specific attribute to a database containing LVS correspondences between a layout and a schematic diagram or netlist. The correspondences are a map between schematic composite structures and layout composite structures and the nodal connections therebetween. Often the composite structures are created by a LVS program to reduce the number of logically equivalent transistor-level implementations. Under normal conditions this information is not used after the layout has been verified.

Mapping information is retrieved from the database generated by LVS program 34. The mapping information which corresponds the netlist to the layout is placed in a connectivity mapping file 35. Attributes or characteristics placed on the netlist are mapped to the layout. For example, connectivity mapping file 35 includes device orientation information from oriented netlist 31 that is mapped to non-oriented layout 33. The method of retrieving connectivity information varies between LVS programs offered by different software manufacturers. The exact method of extracting the mapping information is determined by the specific program being used. It should be understood that one skilled in the art of computer aided design would be able to retrieve this information.

The composite information often does not correspond exactly between layout and netlist. Correspondence between layout and netlist can be functionally equivalent. For example, one large transistor specified in the schematic is often implemented as a parallel connection of many smaller transistors in layout. Another example is the logical equivalence of any permuted series connections of transistors, which implies that transistor orderings in schematic and layout may be different. schematic transistor does not have to correspond exactly to the corresponding layout. In other words, the layout could place the series transistors in a different order but still be functionally equivalent. Instead, the net-specific attribute is assigned to the layout transistor having the corresponding net connection. For example, a net-specific attribute is assigned to a transistor (of a transistor series stack) of a schematic diagram having a source terminal coupled to a ground node. The attribute would be mapped to a transistor of the layout having a source terminal coupled to ground. The transistor of the layout is not necessarily the same transistor as in the schematic diagram.

Oriented layout 37 is provided to a layer generation program 38 that generates layers to add a feature. Layout generation program 38 also uses information from connectivity mapping file 35. Layer generation program 38 specifies which devices require the added feature. For example, an extra implant as described hereinabove is needed to enhance performance in a critical path of a circuit. The extra implant may be required for a small number of devices when compared with the total device count of the circuit. Connectivity mapping file 35 or oriented layout 37 provides information to layer generation program 38 to identify the location of the MOSFETs requiring the extra implant. Layer generation program 38 then accesses the layer of oriented layout 37 marking the source regions of the MOSFETs. Layer generation program 38 then generates a layer (or layers) to add the extra implant producing a layout with added feature 39. The layers generated by layer generation program 38 would conform to the wafer processing rules being used.

In particular, the generation of new layouts by layout generation program 38 is repetitive and easily automated. For example, the position of a MOSFET transistor is determined by the overlap of a polysilicon gate over nitride. The source of the MOSFET is identified via markings placed on a layer of oriented layout 37. Hence, the shape and location of an added feature such as an extra implant, is suitable for automation by post processing as shown in FIG. 3. The additional layers that form a feature conform to the design rules of a semiconductor wafer process being used. A Design Rules Check (DRC) is run on the layout to insure that the guidelines are met.

An oriented netlist is not always available to map to a non-oriented layout. An alternate approach is a heuristic approach. A heuristic orientation method, for example, applies a set of heuristic rules to determine proper transistor orientations. The rule set is applied to a netlist or schematic diagram to generate an oriented netlist or applied to a non-oriented layout to determine device orientation. For example, identifying and marking the gates of each transistor in a circuit will locate each device on a layout. The drain or sources (orientation) of each transistor is not determined at this point. One rule of a heuristic rule set would be to find transistors of the circuit having a terminal region coupled to a power supply terminal. The terminal would be identified as a source if it is a p-channel MOSFET and it is coupled to the positive most power supply voltage or a n-channel MOSFET coupled to the negative most power supply voltage. Other rules would have to be generated for identifying drains and sources of series or parallel coupled transistors.

In general, a method for adding an attribute on a schematic diagram to a layout uses a Layout Versus Schematic (LVS) program to generate a database of information correlating the layout to the schematic diagram. Information correlating the attribute in the schematic diagram to the layout is retrieved from the database. Layers which identify the attribute on the layout are identified which are used to form other features on the layout.

A netlist of a circuit is provided to a layout tool to generate a non-oriented layout. Device orientation that is identified on the netlist is not passed to the layout by the layout tool. Knowledge of device orientation is required to add a feature to the layout. A LVS program is used to generate a database correlating the netlist to the layout. Connectivity information is retrieved from the database which maps the netlist to the non-oriented layout. Information pertaining to device orientation is also included in the database. A mapping program uses the retrieved information to generate layers for the non-oriented layout which identifies device orientation. The layers are added to the non-oriented layout to produce an oriented layout. Features which require knowledge of device orientation are then generated for the oriented layout using a layer generation program conforming to the wafer process rules.

By now it should be appreciated that a method for adding a feature to a layout has been provided that reduces design and manufacturing cycle time. In general, an attribute on a netlist is transferred to a layout. The attribute is required on the layout to determine where or how a feature is placed on the layout. An LVS program is used to generate a database of information correlating a layout to a schematic diagram (or netlist). Information is retrieved from the database and placed in a mapping file correlating the attribute from the schematic diagram to the layout. Layers are generated which identify the attribute in the layout. A program is used to generate layers adding the feature. The program uses information from the mapping file and the layers added to the layout which identify the attribute in the layer generation process.

In the preferred embodiment, the attribute added is device orientation. The method uses an LVS program to map an oriented netlist or schematic diagram to a non-oriented layout. A mapping file is then used to identify device orientation on the layout. A layer is generated in the layout identifying device orientation. Once a device orientation has been identified in the layout, a program is run to add a feature that requires knowledge of device orientation. The program generates masking layers to add the feature to identified devices requiring the feature.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

I claim:

1. A method for adding a feature to a layout of a semiconductor integrated circuit, knowledge of device orientation on the layout is required to generate layers to add the feature, the method comprising the steps of:

providing a netlist having device orientation;

generating a non-oriented layout from said netlist with a layout tool;

using a Layout Versus Schematic (LVS) program to generate a database correlating the layout to said netlist;

retrieving connectivity information from said database; and using a mapping program with said connectivity information to generate layers which identify device orientation on said non-oriented layout, said layers which identify device orientation combined with said non-oriented layout form an oriented layout.

2. The method as recited in claim 1 wherein said step of retrieving connectivity information includes a step of placing said connectivity information in a mapping file.

3. The method as recited in claim 2 further including a step of placing polygons on said layers which identify device orientation, each polygon type corresponds to an attribute pertaining to device orientation.

4. The method as recited in claim 3 further including a step of using a layer generation program to add the feature to said oriented layout, said layer generation program uses said mapping file and said oriented layout to determine a placement of the feature when generating layers to fabricate the feature.

5. The method as recited in claim 4 wherein said step of using a layer generation program includes the steps of:

locating devices in said oriented layout which require the feature;

identifying devices and device orientation with said mapping file and said layers which identify device orientation generated by said mapping program; and generating said layers to add the feature on said oriented layout.

6. A method for providing an attribute on a netlist of a circuit to a layout of the circuit comprising the steps of:

providing the netlist to a layout tool to generate the layout wherein the attribute is not placed on the layout by the layout tool;

using a Layout Versus Schematic (LVS) program to generate a database correlating the netlist to the layout;

retrieving information from said database generated by said LVS program that correlates the attribute of the netlist to the layout; and adding the attribute to the layout using information retrieved from said database.

7. The method as recited in claim 6 wherein the step of providing the netlist to a layout tool to generate the layout includes a step of placing an attribute of device orientation on the netlist.

8. The method as recited in claim 7 wherein the step of providing the netlist to a layout tool to generate the layout produces a non-oriented layout.

9. The method as recited in claim 8 wherein the step of retrieving information from a database generated by said LVS program includes the steps of:

retrieving connectivity information mapping the netlist to the layout; and placing said connectivity information in a mapping connectivity file.

10. The method as recited in claim 9 wherein the step of adding the attribute to the layout includes a step of using a mapping program with said mapping connectivity file to generate layers identifying device orientation of said non-oriented layout, said layers generated by said mapping program combined with said non-oriented layout form an oriented layout.

11. The method as recited in claim 10 further including a step of using a layer generation program to add a feature to said oriented layout, said layer generation program generating layers to fabricate said feature and said layer generation program using said connectivity mapping file in combination with said layers identifying device orientation to locate where said feature is placed.

12. A method for adding an attribute identified on a schematic diagram to a layout of an integrated circuit, the method comprising the steps of:

using a Layout Versus Schematic (LVS) program to generate a database of information correlating the layout to the schematic diagram;

retrieving information correlating the attribute in the schematic diagram to the layout; and generating layers which identify the attribute on the layout.

* * * * *